(12) United States Patent
Sugawara

(10) Patent No.: US 7,243,180 B2
(45) Date of Patent: Jul. 10, 2007

(54) SEMICONDUCTOR MEMORY DEVICE WITH BUS DRIVER CIRCUIT CONFIGURED TO TRANSFER AN OUTPUT ON A COMMON BUS ONTO AN OUTPUT BUS WITH INVERSION OR NO INVERSION

(75) Inventor: Hiroshi Sugawara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 137 days.

(21) Appl. No.: 11/090,357

(22) Filed: Mar. 28, 2005

(65) Prior Publication Data
US 2005/0223152 A1 Oct. 6, 2005

(30) Foreign Application Priority Data
Mar. 30, 2004 (JP) ............................. 2004-101356

(51) Int. Cl.
G11C 11/409 (2006.01)
G11C 11/419 (2006.01)
G11C 16/06 (2006.01)
G11C 11/4063 (2006.01)
G11C 11/413 (2006.01)
G06F 138/00 (2006.01)

(52) U.S. Cl. ................. 710/305; 710/316; 365/185.21; 365/189.05

(58) Field of Classification Search ................. 710/100, 710/305, 316; 711/100; 365/185.21, 185.12, 365/185.23, 189.01, 189.05, 230.02, 230.06
See application file for complete search history.

(56) References Cited

U.S. PATENT DOCUMENTS

| | | | | |
|---|---|---|---|---|
| 5,617,361 A | * | 4/1997 | Sugawara | 365/189.01 |
| 5,796,652 A | * | 8/1998 | Takeshima et al. | 365/185.03 |
| 5,936,888 A | * | 8/1999 | Sugawara | 365/185.2 |
| 5,973,963 A | * | 10/1999 | Sugawara | 365/185.23 |
| 6,064,592 A | * | 5/2000 | Nakagawa et al. | 365/185.05 |
| 6,064,597 A | * | 5/2000 | Takeshima et al. | 365/185.24 |
| 6,291,843 B1 | * | 9/2001 | Sugawara | 257/208 |
| 6,687,166 B1 | * | 2/2004 | Takahashi et al. | 365/189.05 |
| 6,788,600 B2 | * | 9/2004 | Sugawara et al. | 365/207 |
| 6,937,515 B2 | * | 8/2005 | Sudo et al. | 365/185.12 |
| 2005/0223152 A1 | * | 10/2005 | Sugawara | 710/316 |

FOREIGN PATENT DOCUMENTS

JP 2000-149565 A 5/2000

OTHER PUBLICATIONS

"A 1.8-V 128Mb mobile DRAM with double boosting pump, hybrid current sense amplifier, and dual-referenced adjustment scheme for temperature sensor" by Sim et al. (abstract only) Publication Date: Apr. 2003.*

* cited by examiner

Primary Examiner—Gopal C. Ray
(74) Attorney, Agent, or Firm—Sughrue Mion, PLLC

(57) ABSTRACT

A semiconductor memory device includes first to third data buses, and first and second connection circuits. The first connection circuit inverts and transfers a first output signal on the first data bus read out from a memory onto the second data bus in response to a first selection signal, inverts and transfers a second output signal on the second data bus read out from the memory onto the first data bus in response to a second selection signal, and connects the first and second data buses in response to a reset signal. The second connection circuit inverts and transfers the inverted first output signal on the second data bus onto the third data bus in response to the first selection signal and transfers the second output signal on the second data bus onto the third data bus in response to the second selection signal.

4 Claims, 7 Drawing Sheets

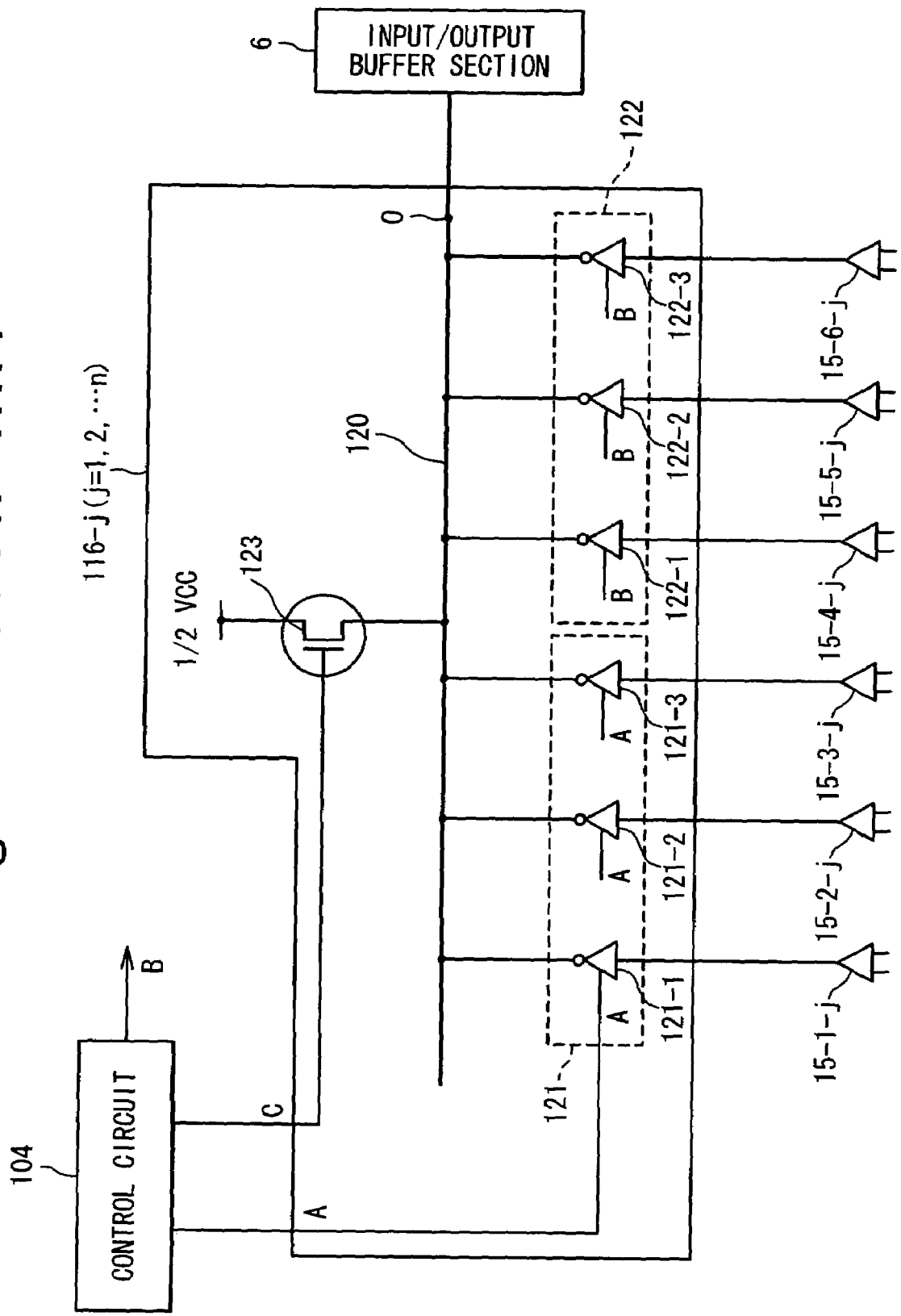

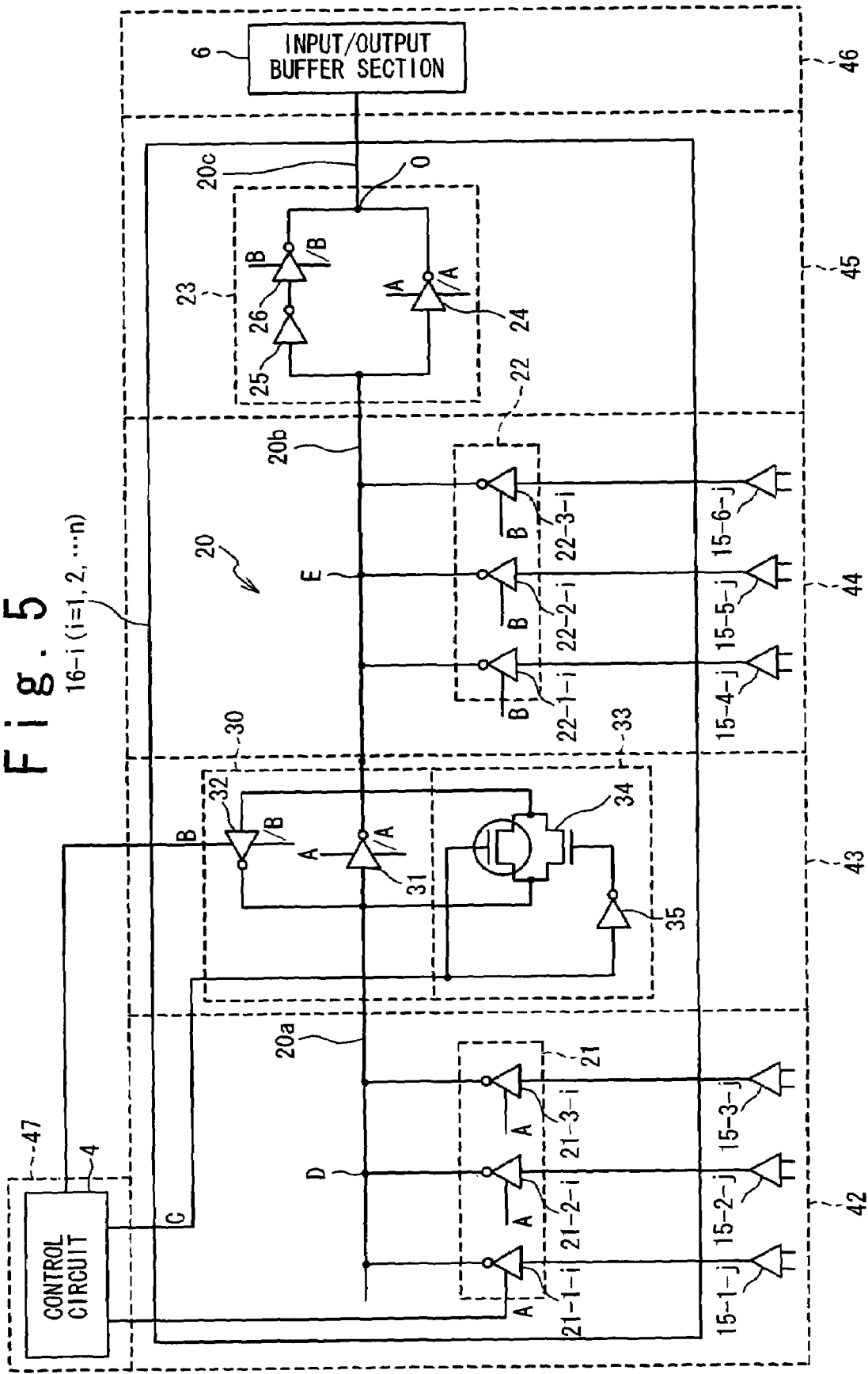

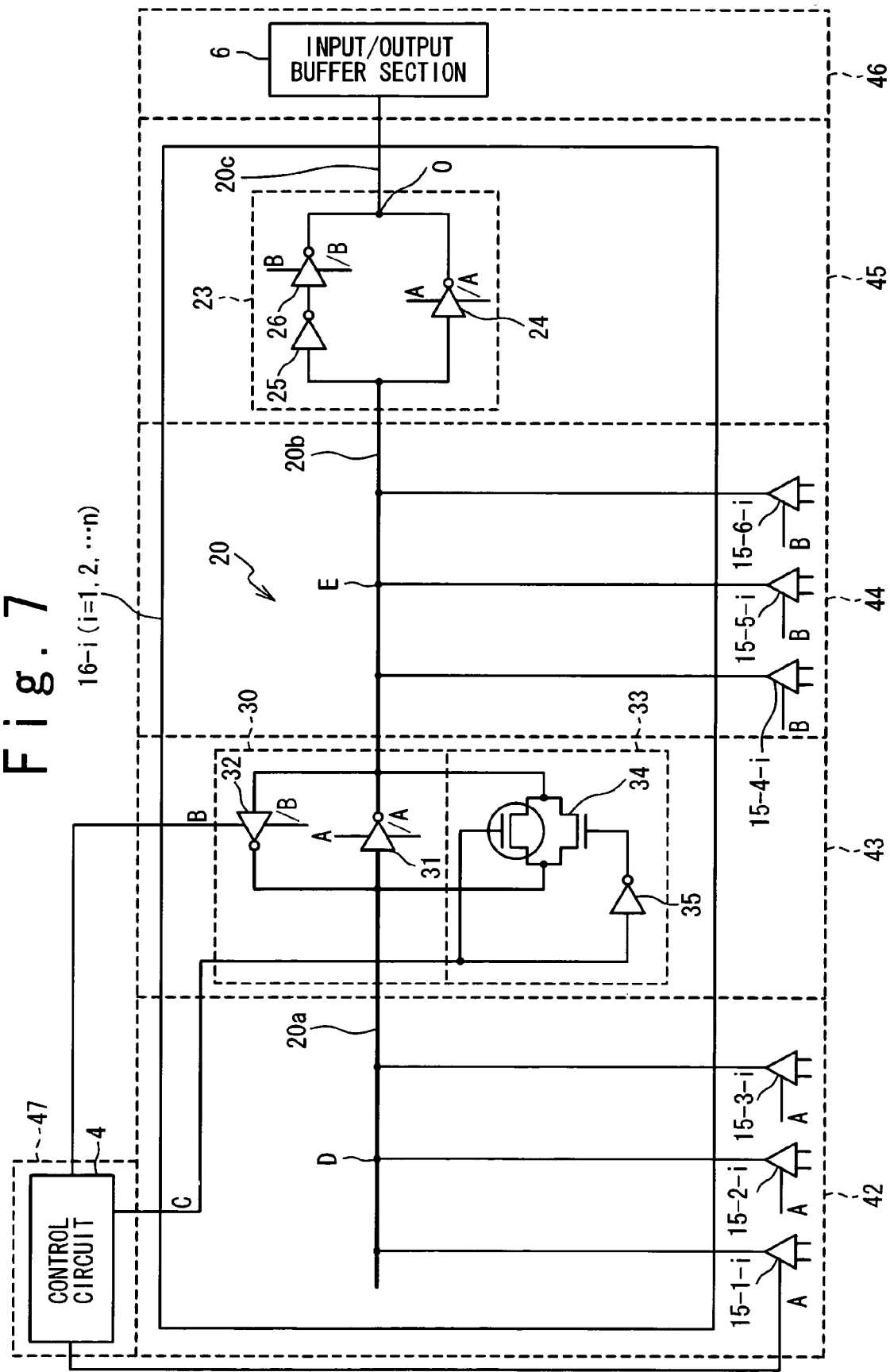

SEMICONDUCTOR MEMORY DEVICE WITH BUS DRIVER CIRCUIT CONFIGURED TO TRANSFER AN OUTPUT ON A COMMON BUS ONTO AN OUTPUT BUS WITH INVERSION OR NO INVERSION

BACKGROUND OF THE INVENTION

1. Field of the Invention

The present invention relates to a semiconductor memory device and a method of outputting data signals from the semiconductor memory device.

2. Description of the Related Art

In recent years, a high-speed operation has been required in a semiconductor memory device. As a method of speeding up the operations of the semiconductor memory device such as a read operation and a write operation, it could be considered to control a data bus. In a period of an output operation, a signal level of a power supply voltage $V_{CC}$ or a ground voltage GND is conventionally applied to the data bus. However, this method is insufficient. However, the operation speed tends to delay due to a large parasitic capacitance of the data bus. For this reason, the voltage of $(\frac{1}{2})V_{CC}$ is applied to the data bus in an equalizing period. Thus, the data bus is pre-charged and the output operation is sped-up after the equalizing period.

FIG. 1 is a block diagram showing a configuration of a conventional flash memory as a semiconductor memory device. The flash memory 100 is provided on a semiconductor chip. The flash memory 100 includes an address buffer section 2, a plurality of plates 3-1 to 3-6, an output bus section 116, and an input/output buffer section 6, a control circuit 104, and a boosting circuit 5. Terminals 1-1 to 1-n (n is an integer of one or more) are connected with the address buffer section 2. Terminals 7-1 to 7-n are connected with the input/output buffer section 6. The terminals 7-1 to 7-n are provided for the terminals 1-1 to 1-n, respectively. The output bus section 116 includes output bus units 116-1 to 116-n. The output bus units 116-1 to 116-n are allocated to the terminal 7-1 to 7-n, respectively. The output bus units 116-1 to 116-n are connected with the respective plates 3-1 to 3-6 and the input/output buffer section 6.

An address is supplied from the external of the flash memory 100 to the address buffer section 2 through the terminals 1-j (j=1, 2, . . . , n). The address buffer section 2 outputs an address signal to each of the plates 3-1 to 3-6 in accordance with a signal level of an internal circuit. The plate 3-k (k=1 to 6) outputs data as a data output signal based on the address signal. The data output signals output from the plates 3-k are gathered to the output bus units 116-j and are supplied to the input/output buffer section 6. The input/output buffer section 6 generates output data after adjusting the signal levels of the output data signals in accordance with an external signal level, and outputs the output data outside the flash memory 100 through the terminals 7-j. The control circuit 104 receives control data from the input/output buffer section 6. The control circuit 104 determines an operation of the flash memory 100 based on the control data to generate control signals. The control circuit 104 distributes the control signals to the boosting circuit 5, the plates 3-j, and the output buses 116-j, to control the flash memory 100. The boosting circuit 5 distributes the boosted power supply voltage to the plates 3-j.

The plate 3-k (k=1, 2, . . . 6) is a unit of functional blocks of the flash memory 100, and includes sectors 13-1 to 13-n, a global row decoder 11-k, local row decoders 12-k, a column decoder 9-k, a sense amplifier circuit 15-k, a reference cell section 14-k, and a power supply switching section 8-k. The sense amplifier circuit 15-k includes sense amplifiers 15-k-j (15-k-1 to 15-k-n). The sectors 13-j (j=1 to n) are provided for the sense amplifiers 15-k-j, respectively. The sense amplifiers 15-k-j are provided for the output bus units 116-j, respectively. Each of the sectors 13-j is a minimum unit upon erasing its stored data, and includes a plurality of the memory cells. The power supply switching section 8-k switches the power supply voltage from the boosting circuit 5 in response to the control signal from the control circuit 104, and supplies to the global row decoder 11-k and the column decoder 9-k.

The address signal is distributed to the global row decoder 11-k, the local row decoders 12-k, and the column decoder 9-k in the plate 3-k. A row address of the address signal is decoded by the global row decoder 11-k and the local row decoder 12-k to select one of word lines. A column address of the address signal is decoded by the column decoder 9-k to select one of bit lines. The selected word line and selected bit line specify one of the memory cells, from which data is read out, and into which the data is written. The data read out from the selected memory cell is compared with data read out from the reference cell section 14 by the sense amplifier circuit 15-k. The sense amplifier circuit 15-k outputs the comparison result to the output bus section 116-j as the above-mentioned data output signal.

FIG. 2 shows the control circuit 104 and the output bus unit 116-j of the output bus section 116. As shown in FIG. 2, the control circuit 104 outputs a first selection signal A or a second selection signal B, and a reset signal C alternately to the output bus unit 116-j as the above-mentioned control signals. For instance, the first selection signal A indicates an active state when the signal level is low, and an inactive state when the signal level is high. The second selection signal B indicates an active state when the signal level is low, and an inactive state when the signal level is high. The reset signal C indicates an active state when the signal level is low, and an inactive state when the signal level is high.

The output bus section 116-j includes a data bus 120, a first output section 121 a second output section 122, and a P-channel transistor 123. The input/output buffer section 6 is connected with the data bus 120.

The first output section 121 has inverters 121-1 to 121-3. the input of the inverter 121-1 is connected with the output of the sense amplifier 15-1-j in the plates 3-1, and the input of the inverter 121-2 is connected with the output of the sense amplifier 15-2-j in the plates 3-2. The outputs of the inverters 121-1 to 121-3 are connected with the data bus 120. The inverters 121-1 to 121-3 are connected with and controlled by the control circuit 104. Each of the inverters 121-1 to 121-3 inverts the signal output from the corresponding sense amplifier in response to the first selection signal A of the low level from the control circuit 104, and outputs the inverted signal. The second output section 122 has inverters 122-1 to 122-3. The input of the inverter 122-1 is connected with the output of the sense amplifier circuit 15-4-j in the plate 3-4, and the input of the inverters 122-2 is connected with the output of the sense amplifier circuit 15-5-j in the plate 3-5. The outputs of the inverters 122-1 to 122-3 are connected with the data bus 120. The inverters 122-1 to 122-3 are connected with and controlled by the control circuit 104. Each of the inverters 122-1 to 122-3 inverts a signal output from the corresponding sense amplifier in response to the second selection signal B of the low level from the control circuit 104, and outputs the inverted signal.

The voltage of $(½)V_{CC}$ that is a half of the power supply voltage $V_{CC}$ is supplied to the source of the P-channel transistor 123. The drain of the P-channel transistor 123 is connected with the data bus 120. The gate of the P-channel transistor 123 is connected with the control circuit 104. The reset signal C of the low level from the control circuit 104 is supplied to the gate of the P-channel transistor 123.

FIGS. 3A to 3D are timing charts showing an operation of the output bus section 116-j in the flash memory 100. The control unit 104 controls the P-channel transistor 123 so that an action period ACT and an equalizing period EQC are repeated alternately. The control unit 104 outputs the first selection signal A of the low level or the second selection signal B of the low level to specify the action period ACT. Also, the control unit 104 outputs the reset signal C of the low level to specify the equalizing period EQC.

First, the control circuit 104 determines the operation to be carried out by the flash memory 100 based on the control data from the address buffer section 2. As a result, for instance, it is supposed that the control circuit 104 determines that the sense amplifier circuit 15-1-1 in the plate 3-1 should output the data output signal to the output bus unit 116-1. In this case, the control unit 104 outputs the first selection signal A of the low level to specify the action period ACT.

In the action period ACT, it is supposed that the signal level of the data output signal to be output from the sense amplifier circuit 15-1-1 onto the output bus unit 116-1 indicates a ground voltage GND. The inverter 121-1 of the first output circuit 121 in the output bus unit 116-1 inverts the data output signal from the sense amplifier circuit 15-1-1 in response to the first selection signal A of low level and outputs the inverted signal to the data bus 120. At this time, the inverter 121-1 outputs the data output signal of a power supply voltage $V_{CC}$. A signal level O applied to the data bus 120 indicates the power supply voltage $V_{CC}$. In the action period ACT, the input/output buffer section 6 inverts the signal output onto the data bus 120. The input/output buffer section 6 generates output data adjusted to an external signal level based on the ground voltage GND, and then outputs the output data to the external of the flash memory 100 through the terminal 7-1.

Next, the control circuit 104 outputs the reset signal C of the low level to specify the equalizing period EQC. In the equalizing period EQC, the P-channel transistor 123 of the output bus unit 116-1 is turned on in response to the reset signal C of the low level, and applies the Voltage $(½)V_{CC}$ to the data bus 120 compulsorily. In this way, in the equalizing period EQC in the flash memory 100, the Voltage of $(½)V_{CC}$ is applied to the data bus 120. That is, the data bus 120 is pre-charged to the Voltage $(½)V_{CC}$. Thus, the operation such as a read operation is speeded up in the action period ACT following to the equalizing period EQC. However, the data bus 120 is compulsorily pre-charged to the voltage of $(½)V_{CC}$ in the equalizing period EQC without no relation to the voltage applied to the data bus 120 in the action period ACT. Therefore, the power supply voltage $V_{CC}$ drops possibly. In this case, the flash memory 100 cannot carry out the operation at high speed.

Also, in the flash memory 100, the data bus 120 is compulsorily pre-charged to the voltage of $(½)V_{CC}$ in the equalizing period EQC without any relation to the voltage applied to the data bus 120 in the action period ACT. Therefore, power consumption of the flash memory 100 increases.

In conjunction with the above description, another conventional semiconductor memory device is disclosed in Japanese Laid Open Patent Application (JP-P2000-149565A). the semiconductor memory device in this conventional example includes a data bus driver, an I/O line, and a data bus. The output of a sense amplifier and the output of the data bus driver are connected with the I/O line. The output of the data bus driver is connected with the data bus. An equalizing circuit is connected to the I/O line and the data bus. The signal from the sense amplifier is applied to the I/O line. The data bus driver inverts the signal applied to the I/O line to output the inverted signal to the data bus. The equalizing circuit stores the signal applied to the I/O line in a capacitor. The equalizing circuit generates a signal with a signal level between the voltage level of the capacitor and the voltage level of the data bus in response to an equalized signal. Thus, the equalizing circuit outputs the generated signal to the data bus.

SUMMARY OF THE INVENTION

In an aspect of the present invention, a semiconductor memory device includes first to third data buses, a first connection circuit and a second connection circuit. The first connection circuit is provided between the first data bus and the second data bus, inverts and transfers a first output signal on the first data bus read out from a memory section onto the second data bus in response to a first selection signal, inverts and transfers a second output signal on the second data bus read out from the memory section onto the first data bus in response to a second selection signal, and connects the first data bus and the second data bus in response to a reset signal. The second connection circuit provided between the second data bus and the third data bus inverts and transfers the inverted first output signal on the second data bus onto the third data bus in response to the first selection signal and transfers the second output signal on the second data bus onto the third data bus in response to the second selection signal.

Here, it is preferable that the length of the first data bus is substantially equal to that of the second data bus.

Also, the semiconductor memory device may further include a first sense amplifier section configured to amplify and output a signal read out from the memory section onto the first data bus as the first output signal in response to the first selection signal, and a second sense amplifier section configured to amplify and output a signal read out from the memory section onto the second data bus as the second output signal in response to the second selection signal. In this case, when one of the output of the first sense amplifier section and the output of the second sense amplifier section is effective, the other is not effective.

Also, the bus length between the third data bus and the first sense amplifier section is longer than a bus length between the third data bus and the second sense amplifier section.

Also, the first sense amplifier section and the first data bus may be provided in a first area of a chip area, and the second sense amplifier section and the second data bus may be provided in a second area of the chip area. In this case, the first connection circuit is provided in a third area of the chip area between the first area and the second area. In this case, the first sense amplifier section and the first data bus may be provided in a first area of a chip area, and the third data bus and the bus driver circuit may be provided in a second area of the chip area. In this case, the second sense amplifier section and the second data bus are provided in a third area of the chip area between the first area of the chip area and the second area of the chip area, and the first connection circuit is provided in a fourth area of the chip area between the first area and the third area.

Also, the first connection circuit may include an inverting unit provided between the first data bus and the second data bus to invert and transfer the first output signal on the first data bus onto the second data bus in response to the first selection signal, and to invert and transfer the second output signal on the second data bus onto the first data bus in response to the second selection signal; and an equalizing circuit configured to connect the first data bus and the second data bus in response to the reset signal. In this case, the equalizing circuit may include a transfer gate in which one of terminals is connected with the first data bus and the other terminal is connected with the second data bus. The reset signal is supplied directly to one of two gates of the transfer gate, and the reset signal is supplied to the other gate of the transfer gate through an inverter.

Also, the second connection circuit may include a first buffer section configured to invert and transfer the inverted first output signal on the second data bus onto the third data bus in response to the first selection signal, and a second buffer section configured to transfer the second output signal on the second data bus onto the third data bus in response to the second selection signal.

Also, the semiconductor memory device may further include a control circuit configured to generate the first selection signal or the second selection signal, and the reset signal alternately.

In another aspect of the present invention, a method of outputting data signals in a semiconductor memory device is achieved by sensing a signal read out from a memory section to output onto a first data bus as a first output signal in response to a first selection signal; by inverting and transferring the first output signal on the first data bus onto a second data bus in response to the first selection signal; by inverting and transferring the inverted first output signal on the second data bus onto a third data bus in response to the first selection signal; and by connecting the first data bus and the second data bus in response to a reset signal to equalize voltages of the first and second data buses.

Here, the method may be achieved by further including sensing a signal read out from the memory section to output onto the second data bus as a second output signal in response to a second selection signal; transferring the second output signal on the second data bus onto the first data bus and the third bus in response to the second selection signal; and connecting the first data bus and the second data bus in response to the reset signal to equalize voltages of the first and second data buses.

Also, it is preferable that the length of the first data bus is substantially equal to that of the second data bus.

Also, the method may further include generating the first selection signal or the second selection signal, and the reset signal alternately.

BRIEF DESCRIPTION OF THE DRAWINGS

FIG. 2 is a block diagram showing an output bus unit in the conventional flash memory;

FIG. 5 is block diagram showing an output bus unit in the flash memory of the present invention;

FIG. 7 is block diagram showing another output bus unit in the flash memory of the present invention.

DESCRIPTION OF THE PREFERRED EMBODIMENTS

Hereinafter, a semiconductor memory device of the present invention will be described in detail with reference to the attached drawings.

Figure 1:
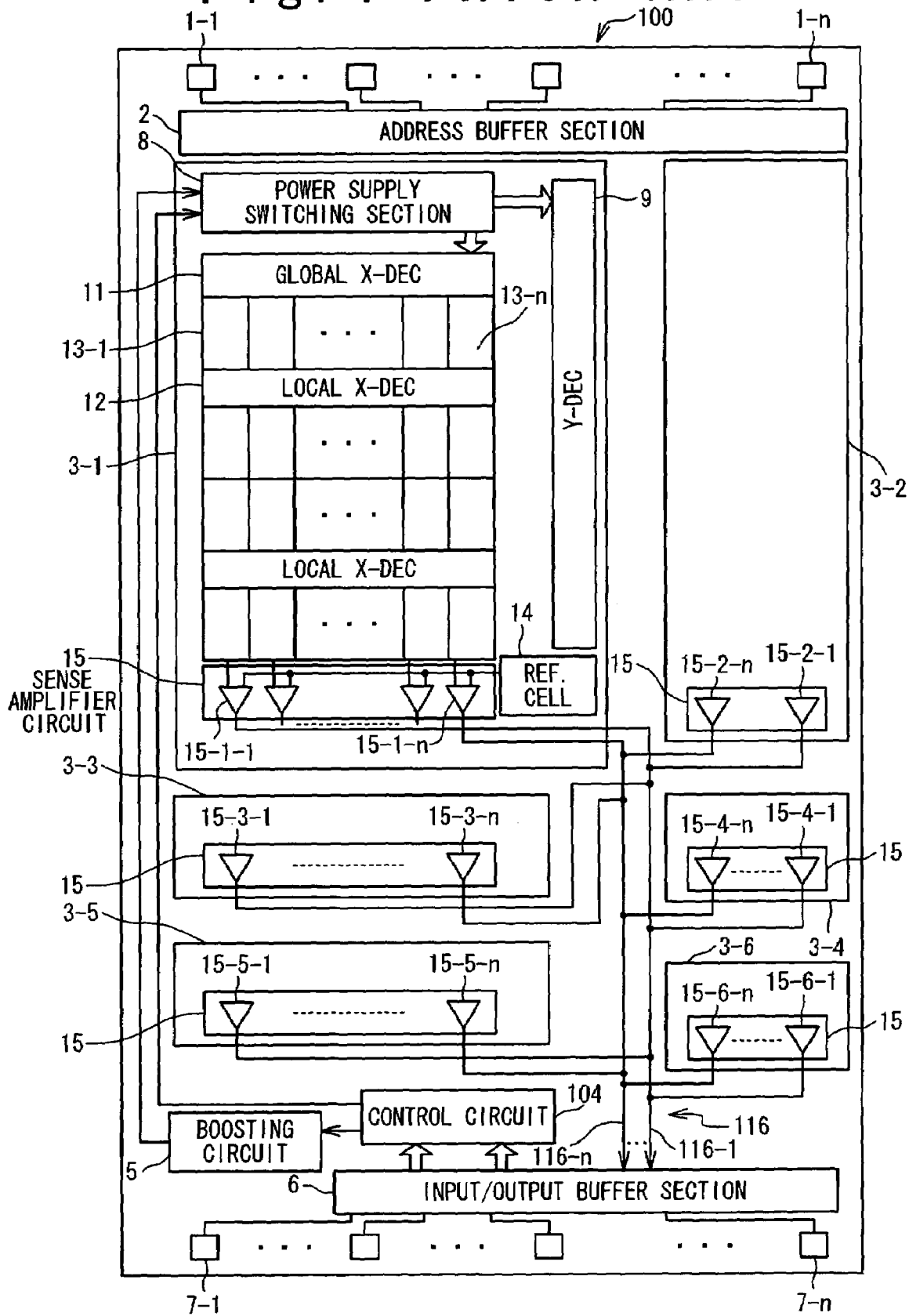
FIG. 1 is a block diagram showing a configuration of a conventional flash memory as a semiconductor memory device.
Figures 3A, 3B, 3C, 3D:
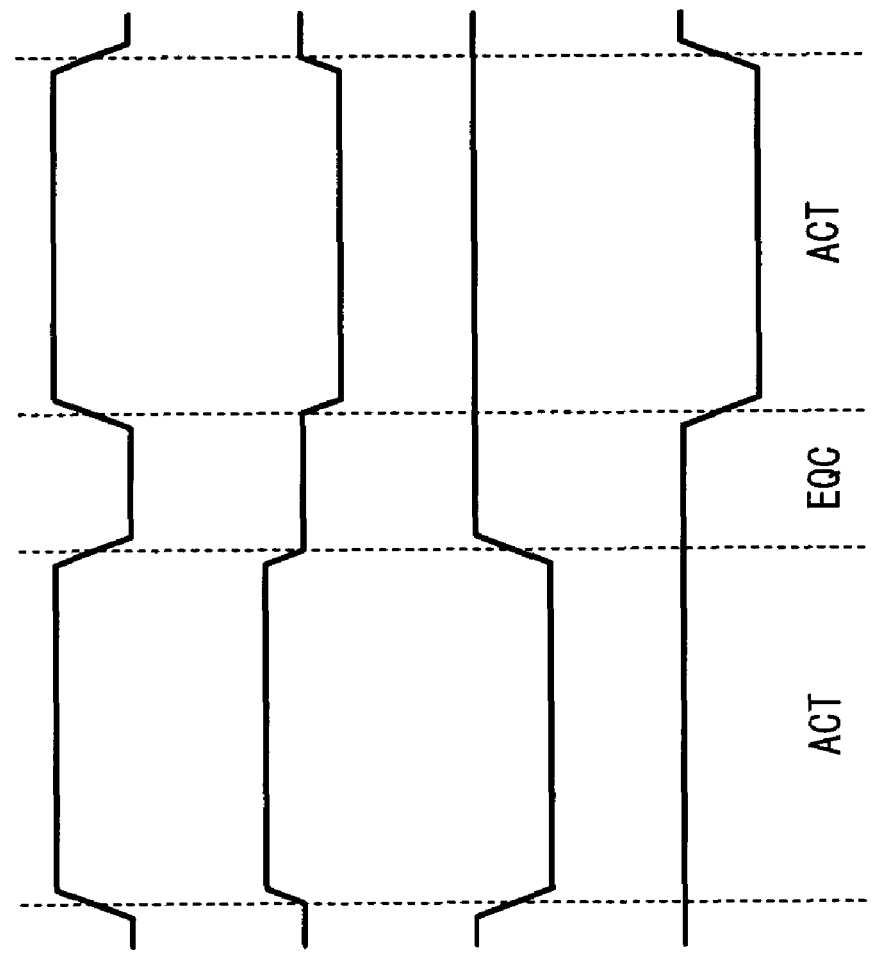
FIGS. 3A to 3D are timing charts showing an operation of the output bus section in conventional flash memory.
Figure 4:
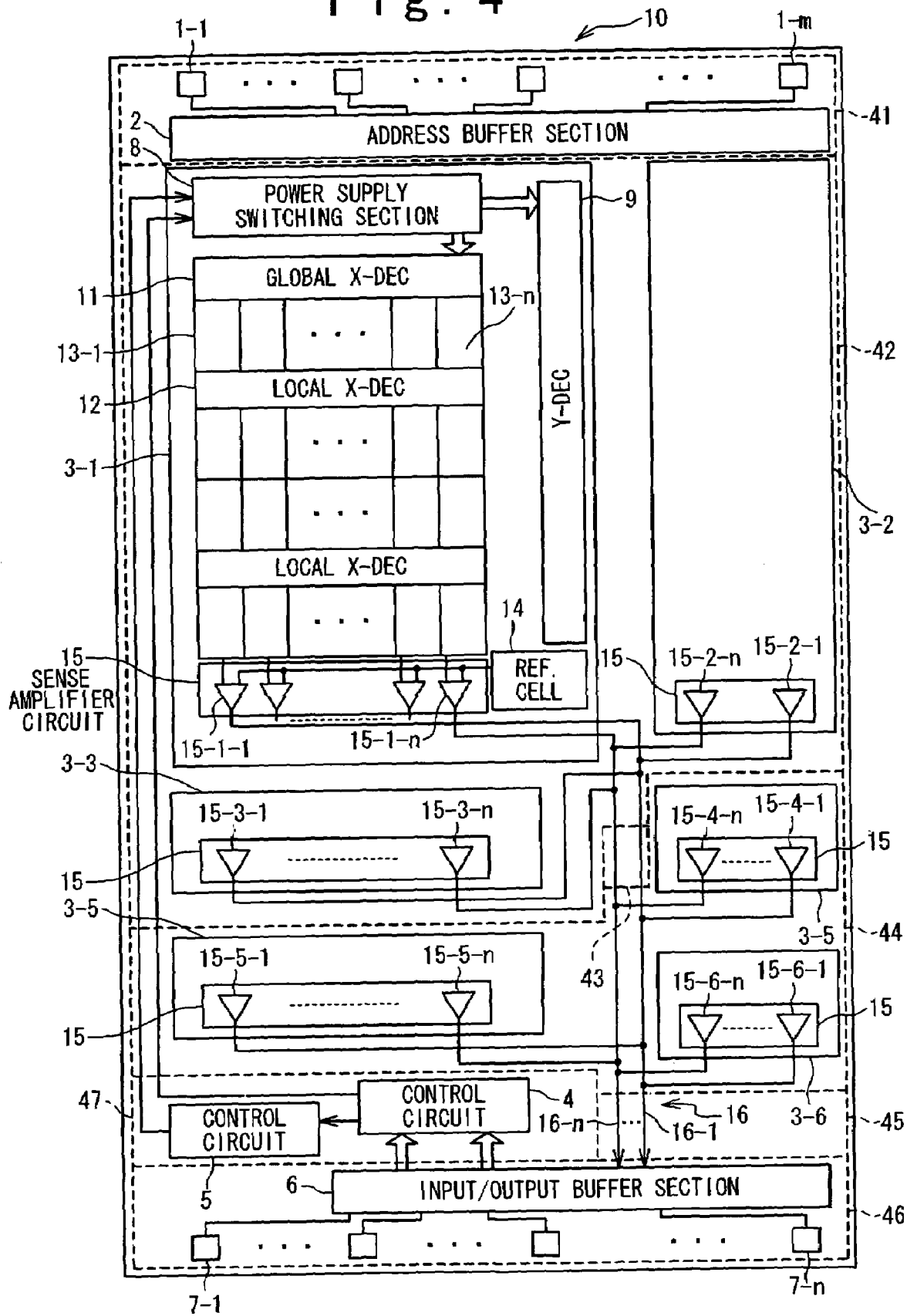
FIG. 4 is a block diagram showing a configuration of a flash memory as a semiconductor memory device of the present invention.
Figures 6A, 6B, 6C, 6D:
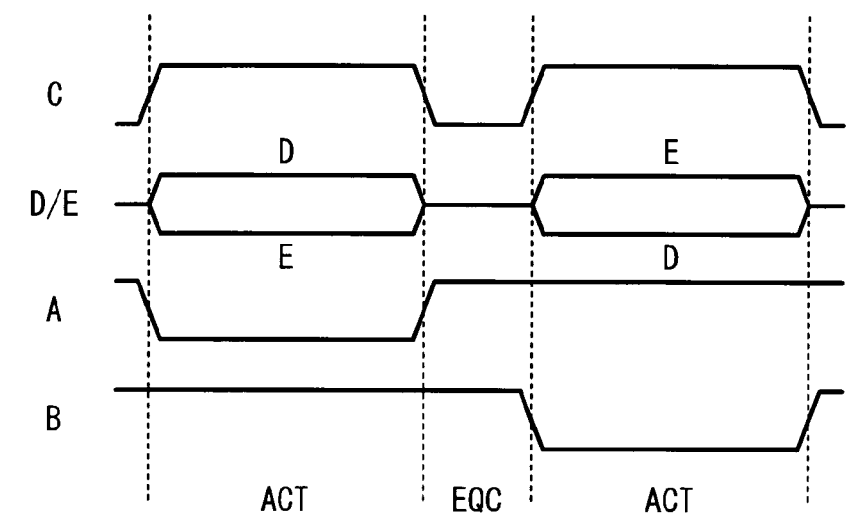
FIGS. 6A to 6D are timing charts showing an operation of the output bus unit in the flash memory of the present invention.

FIG. 4 is a block diagram showing a configuration of a flash memory as the semiconductor memory device of the present invention. The flash memory 10 is provided on a semiconductor chip. The flash memory 10 includes an address buffer section 2, a plurality of plates 3-1 to 3-6, an output bus section 16, and an input/output buffer section 6, a control circuit 4, and a boosting circuit 5. Terminals 1-1 to 1-m (m is an integer of one or more) are connected with the address buffer section 2. Terminals 7-1 to 7-n are connected with the input/output buffer section 6. The output bus section 16 includes output bus units 16-1 to 16-n. The output bus units 16-i (i=1, 2, . . . , n) are provided for the terminals 7-i, respectively. The output bus units 16-i are connected with each of the respective plates 3-j (j=1, 2, . . . , 6) and the input/output buffer section 6.

An address is supplied from the external of the flash memory 10 to the address buffer section 2 through the terminals 1-l (l=1, 2, . . . m). The address buffer section 2 generates an address signal to be adaptive to a signal level of an internal circuit. The address signal is supplied to the plates 3-j. Each of the plates 3-j outputs a stored data as a data output signal based on the address signal. The data output signals are gathered to the output bus unit 16-i and are supplied to the input/output buffer section 6. The input/output buffer section 6 adjusts the signal level of the data output signal in accordance with an external signal level and generates output data. Then, the input/output buffer section 6 outputs the output data outside the flash memory 10 through the terminals 7-i. The control circuit 4 receives control data from the input/output buffer section 6. The control circuit 4 determines an operation to be carried out by the flash memory 10 based on the control data. Then, the control circuit 4 generates control signals. The control circuit 4 supplies the control signals to the boosting circuit 5, the plates 3-j, and the output bus units 16-i, to control the flash memory 10. The boosting circuit 5 supplies the boosted power supply voltages to the plates 3-j.

Each of the plates 3-j is a unit of a functional block of the flash memory 10, and includes sectors 13-j-i, a global row decoder 11-j, local row decoders 12-j, a column decoder 9-j, a sense amplifier circuit 15-j, a reference cell section 14-j, and a power supply switching section 8-j. The sense amplifier circuit 15-j includes sense amplifiers 15-j-i. The sectors 13-j-i are provided for the sense amplifiers 15-j-i, respectively. The sense amplifiers 15-j-i are provided for the output bus units 16-i, respectively. Each of the sectors 13-j-i is a minimum unit for the erasing operation of the stored data, and includes a plurality of the memory cells. The power supply switching section 8-j switches a voltage to be supplied between the power supply voltages from the boosting circuit 5 in response to the control signal from the control circuit 4, and supplies the voltage to the global row decoder 11-j and the column decoder 9-j.

The address signal is supplied to the global row decoder 11-j, the local row decoders 12-j, and the column decoder 9-j in the plate 3-j. The global row decoder 11-j and the local row decoders 12-j decode a row address of the address signal to select one of the word lines. The column decoder 9-j selects one of the bit lines. The selected word line and the selected bit line specify a memory cell from which the data is read, and into which the data is written. The data read out from the memory cell is compared with data read out from the reference cell section 14-j in voltage by the sense amplifier circuit 15-j-i. The sense amplifier 15-j-i outputs the comparison result to the output bus unit 16-i as the above-mentioned data output signal.

Regions 41 to 47 are provided on the chip to mount each element of the flash memory 10. The terminals 1-i and the address buffer section 2 are provided on the region 41. The plates 3-1 to 3-3 are provided on the region 42. The plates 3-4 to 3-6 are provided on the region 44. The terminals 7-i and the input/output buffer section 6 are provided on the region 46. The control circuit 4 and the boosting circuit 5 are provided on the region 47. The region 43 occupies the central portion of the chip between the region 41 and the region 46. The region 42 is a region between the region 41 and the region 43. The region 44 is a region between the region 43 and the region 46. The region 45 is a region between the region 44 and the region 46. The region 47 is a region between the region 44 and the region 46. In the present invention, the region 43 is the region between the plate 3-3 and the plate 3-4. However, the present invention should not be limited to this. The region 43 may be a region between the plate 3-1 and the plate 3-2, a region between the plate 3-2 and the plate 3-3, a region between the plate 3-4 and the plate 3-5, or a region between the plate 3-5 and the plate 3-6.

As shown in FIG. 5, the control circuit 4 outputs a first selection signal A or a second selection signal B, and a reset signal C to the output bus unit 16-i as the above-mentioned control signal alternately. For instance, the first selection signal A indicates an active state when the signal level is the low level, and an inactive state when the signal level is high level. The second selection signal B indicates an active state when the signal level is the low level, and an inactive state when the signal level is the high level. The reset signal C indicates an active state when the signal level is the low level, and an inactive state when the signal level is the high level.

The output bus unit 16-i includes a data bus 20-i, a first output circuit 21-i, a second output circuit 22-i, an inverting unit 30-i, an equalizing circuit 33-i, and a bus driver circuit 23-i. The inverting unit and the equalizing circuit constitute a first connection circuit, and the bus driver circuit constitutes a second connection circuit. The data bus 20-i has a first common data bus 20a-i, a second common data bus 20b-i, and a third data bus 20c-i.

The first common data bus 20a-i and the first output circuit 21-i are provided on the region 42. The first output circuit 21-i has inverters 21-1-i to 21-3-i. The input of the inverter 21-j-i ($1 \leq j \leq 3$) is connected with an output of the sense amplifier 15-j-i of the sense amplifier circuit 15-j in the plate 3-j. The output of the inverter 21-j-i is connected with the first common data bus 20a-i. In this case, the sense amplifier 15-j-i is provided on the region 42. Therefore, the sense amplifiers 15-1-j of the sense amplifier circuit 15-j and the inverter 21-1-i of the first output circuit 21-i may be collectively referred to as a sense amplifier unit. The inverters 21-j-i are connected with the control circuit 4. The inverters 21-j-i invert the output signals in response to the first selection signal A of the low level from the control circuit 4, and outputs the inverted output signals, respectively.

The second common data bus 20b-i and the second output circuit 22-i are provided on the region 44. The second output circuit 22 has inverters 22-(j-3)-i ($4 \leq j \leq 6$). The input of the inverter 22-(j-3)-i is connected with the output of the sense amplifier 15-j-i in the plate 3-j. The output of the inverter 22-(j-3)-i is connected with the second common data bus 20b-i. In this case, the sense amplifier 15-J-i is provided on the region 44. Therefore, the sense amplifier 15-j-i and the inverter 22-(j-3)-i of the second output circuit 22-i may be collectively called as a sense amplifier unit. The inverters 22-(j-3)-i are connected with the control circuit 4. The inverters 22-(j-3)-i the output signals in response to the second selection signal B of the low level from the control circuit 4.

The inverting unit 30-i and the equalizing circuit 33-i are provided in the region 43. That is, the inverting unit 30-i and the equalizing circuit 33-i are provided between the first common data bus 20a-i and the second common data bus 20b-i. The bus length between the first common data bus 20a-i provided in the region 42 and the second output circuit 22-i both provided in the region 44 is longer than the bus length between the first common data bus 20a-i and the first output circuit 21-i both provided in the region 42. Also, the bus length between the second common data bus 20b-i provided in the region 44 and the first output circuit 21-i provided in the region 42 is longer than the bus length between the second common data bus 20b-i and the second output circuit 22-i both provided in the region 44.

The inverting unit 30-i includes an inverter 31. The input of the inverter 31 is connected with the first common data bus 20a-i, and the output of the inverter 31-i is connected with the second common data bus 20b-i. The inverter 31-i is connected with the control circuit 4. The inverter 31-i is a clocked inverter and inverts the supplied signal in response to the first selection signal A of the low level. Also, the output thereof becomes high impedance in response to the first selection signal/A of the high level. The above-mentioned second common data bus 20b-i transfers either of the output of the inverter 31-i or the output of the second output circuit 22-i.

The inverting unit 30-i further includes an inverter 32-i. The input of the inverter 32-i is connected with the second common data bus 20b-i, and the output of the inverter 32-i is connected with the first common data bus 20a-i. The inverter 32-i is connected with the control circuit 4. The inverter 32-i is a clocked inverter and inverts the supplied signal in response to the second selection signal B of the low level. Also, the output of the inverter 32-i becomes high impedance in response to the second selection signal of the high level. The above-mentioned first common data bus 20a-i transfers either of the output the inverter 32-i or the output of the first output circuit 21-i.

The equalizing circuit 33 includes an inverter 35-i and a transfer gate 34-i of a P-channel transistor and a N-channel transistor. One terminal of the transfer gate 34-i is connected with the first common data bus 20a-i, and the other is connected with the second common data bus 20b-i. The input of the inverter 35-i is connected with the control circuit 4, and the output of the inverter 35-i is connected with a gate of the N-channel transistor of the transfer gate 34-i. The gate of the P-channel transistor of the transfer gate 34-i is connected with the control circuit 4. Therefore, the reset signal C is supplied from the control circuit 4 directly to the inverter 35-i and the gate of the P-channel transistor of transfer gate 34-i.

The third data bus 20c-i and the bus driver circuit 23-i are provided in the region 45. The bus driver circuit 23-i is provided between the second common data bus 20b-i and the third data bus 20c-i. The third data bus 20c-i as an output bus transfers the output of the bus driver circuit 23-i. The third data bus 20c-i is connected with the input/output buffer section 6. The bus driver circuit 23-i has inverters 24-i to 26-i. The input of the inverter 24-i is connected with the second common data bus 20b-i, and the output of the inverter 24-i is connected with the third data bus 20c-i. The inverter 24-i is connected with the control circuit 4. The inverter 24-i is a clocked inverter and inverts the supplied signal in response to the first selection signal A of the low level. Here, the output thereof becomes high impedance in response to the first selection signal A of the high level. The input of the inverter 25-i is connected with the second common data bus 20b-i, and the output of the inverter 24-i is connected with the input of inverter 26-i. The output of the inverter 26-i is connected with the third data bus 20c-i. The inverter 26-i is connected with the control circuit 4. The inverter 26-i is a clocked inverter and inverts the supplied signal in response to the second selection signal B of the low level. Here, the output thereof becomes high impedance in response to the second selection signal B of the high level.

FIGS. 6A to 6D are timing charts showing an operation of the output bus unit 16-i in the flash memory 10. The control circuit 4 controls the equalizing circuit 33-i so that an action period ACT and an equalizing period EQC are repeated alternately. The control circuit 4 outputs the first selection signal A of the low level or the second selection signal B of the low level to specify the action period ACT. Further, the control circuit 4 outputs the reset signal C of the low level to specify the equalizing period EQC.

First, one of the outputs of the sense amplifiers 15-j-i is made active. The control circuit 4 checks the operation to be carried out by the flash memory 10 in response to the control data from the address buffer section 2. As a result, for instance, the control circuit 4 detects that the sense amplifier 15-j-i of the plate 3-j outputs the data output signal to the output bus unit 16-i. At this time, the control circuit 4 outputs the first selection signal A of the low level to specify the action period ACT. In this case, the inverter 32-i of the inverting unit 30-i in the output bus unit 16-i and the inverter 26-i of the bus driver circuit 23-i in the output bus unit 16-i become high impedance in response to the second selection signal B of the high level.

In the action period ACT, it is supposed that the signal level of the data output signal output from the sense amplifier 15-j-i onto the output bus unit 16-i indicates a ground voltage GND. The inverter 21-j-i of the first output circuit 21-i in the output bus unit 16-i inverts the data output signal in response to the first selection signal A of the low level and outputs the inverted signal onto the first common data bus 20a-i. At this time, the inverter 21-j-i outputs a power supply voltage $V_{CC}$ as the data output signal. The signal level D applied to the first common data bus 20a-i indicates the power supply voltage $V_{CC}$. Also, in the action period ACT, the inverter 31-i of the inverting unit 30-i in the output bus unit 16-i inverts the signal level D applied to the first common data bus 20a-i in response to the first selection signal A of the low level and outputs the inverted signal to the second common data bus 20b-i. At this time, the inverter 31-i outputs the ground voltage GND as the data output signal. A signal level E applied to the second common data bus 20b-i indicates the ground voltage GND. Moreover, in the action period ACT, the inverter 24-i of the bus driver circuit 23-i in the output bus unit 16-i inverts the signal level E applied to the second common data bus 20b-i in response to the first selection signal A of the low level and outputs the inverted signal to the third data bus 20c-i. At this time, the inverter 24-i outputs the power supply voltage $V_{CC}$ as the data output signal. A signal level O applied to the third data bus 20c-i indicates the power supply voltage $V_{CC}$. Furthermore, in the action period ACT, the input/output buffer section 6 inverts the signal level applied to the third data bus 20c-i. The input/output buffer section 6 generates the output data obtained by adjusting the signal level of the data output signal to an external signal level based on the ground voltage GND, and outputs the output data to the outside of the flash memory 10 through the terminal 7-1.

Next, the control circuit 4 outputs the reset signal C of the low level to specify the equalizing period EQC. In this case, the inverter 31-i of the inverting unit 30-i in the output bus unit 16-i and the inverter 24-i of the bus driver circuit 23-i in the output bus unit 16-i become high impedance in response to the first selection signal A of the high level. The inverter 32-i of the inverting unit 30-i in the output bus unit 16-i and the inverter 26-i of the bus driver circuit 23-i in the output bus unit 16-i become high impedance in response to the second selection signal B of the high level. In the equalizing period EQC, the transfer gate 34-i of the equalizing circuit 33-i in the output bus unit 16-i is turned on in response to the reset signal C of the low level, and generates a signal with a middle level of the signal levels D and E. The signal level D is applied to the first common data bus 20a-i, and the signal level E is applied to the second common data bus 20b-i. Here, the signal level D and the signal level E indicate the voltage $(1/2)V_{CC}$ which is a middle voltage of the power supply voltage $V_{CC}$ and the ground voltage GND.

In the flash memory 10 of the present invention, in the period ACT for, e.g., the read operation, the inverter 31-i of the inverting unit 30-i in the output bus unit 16-i inverts the power supply voltage $V_{CC}$ as the signal level applied to the first common data bus 20a-i in response to the first selection signal A. Also, the inverter 31-i applies the ground voltage GND to the second common data bus 20b-i as a signal level. In the equalizing period EQC, the transfer gate 34-i of the equalizing circuits 33-i in the output bus unit 16-i applies the voltage of $(1/2)V_{CC}$ to the first common data bus 20a-i and the second common data bus 20b-i as a signal level in response to the reset signal C. Thus, the buses 20a-i and 20b-i are pre-charged to $(1/2)V_{CC}$, when the length of the first data bus 20a is equal to the length of the second data bus 20b. The flash memory 10 of the present invention includes the inverting unit 30-i and the equalizing circuit 33-i. Therefore, it is easy for the equalizing circuit 33-i to generate the signal level of the voltage $(1/2)V_{CC}$ during the equalizing period EQC. Also, the first common data bus 20a-i and the second common data bus 20b-i can be pre-charged to the voltage $(1/2)V_{CC}$ during the equalizing period EQC. Therefore, in the flash memory 10 of the present invention, the operation speed can be improved.

Second, one of the output of the sense amplifiers 15 becomes effective. The control circuit 4 checks the operation to be carried out by the flash memory 10 in response to the control data from the address buffer section 2. As a result, for instance, the control circuit 4 determines that the sense amplifier 15-(j-3)-i in the plate 3-j outputs the data output signal onto the output bus unit 16-i. At this time, the control circuit 4 outputs the second selection signal B of the low level to specify the action period ACT. In this case, the inverter 31-i of the inverting unit 30-i in the output bus unit 16-i and the inverter 24-i of the bus driver circuit 23-i in the output bus unit 16-i become high impedance in response to the first selection signal A of the high level.

In the action period ACT, it is supposed that the signal level of the data output signal output from the sense amplifier 15-(j-3)-i to the output bus unit 16-i indicates a ground voltage GND. The inverter 22-j-i of the second output circuit 22-i in the output bus unit 16-i inverts the data output signal from the sense amplifier 15-(j-3)-i in response to the second selection signal B of the low level and outputs the inverted signal to the second common data bus 20b-i. At this time, the inverter 22-j-i outputs a power supply voltage $V_{CC}$ as the data output signal. A signal level E applied to the second common data bus 20b-i indicates the power supply voltage $V_{CC}$. Also, in the action period ACT, the inverter 32-i of the inverting unit 30-i in the output bus unit 16-i inverts the signal level E applied to the second common data bus 20b-i in response to the second selection signal B of the low level and outputs the inverted signal to the first common data bus 20a-i. At this time, the inverter 32-i outputs the ground voltage GND. A signal level D applied to the first common data bus 20a-i indicates the ground voltage GND. Moreover, in the action period ACT, the inverter 25-i of the bus driver circuit 23-i in the output bus unit 16-i inverts the signal level E applied to the second common data bus 20b-i and output the inverted signal to the inverter 26-i of the bus driver circuit 23-i. At this time, the inverter 25-i outputs the ground voltage GND as the data output signal. The inverter 26-i inverts the data output signal from the inverter 25-i in response to the second selection signal B of the low level and outputs the inverted signal to the third data bus 20c-i. At this time, the inverter 26-i outputs the power supply voltage $V_{CC}$ as the data output signal. The signal level O applied to the third data bus 20c-i indicates the power supply voltage $V_{CC}$. Furthermore, in the action period ACT, the input/output buffer section 6 inverts the signal level applied to the third data bus 20c-i. The input/output buffer section 6 generates the output data obtained by adjusting the signal level of the data output signal to an external signal level based on the ground voltage GND, and outputs the output data to the outside of the flash memory 10 through the terminal 7-1.

Next, the control circuit 4 outputs the reset signal C of the low level to specify the equalizing period EQC. In the equalizing period EQC, the transfer gate 34-i of the equalizing circuit 33-i in the output bus unit 16-i is turned on in response to the reset signal C of the low level. At this time, the signal level D and the signal level E indicate the voltage $(½)V_{CC}$.

In the flash memory 10 of the present invention, in the operation period for, e.g., the read operation, the inverter 32-i of the inverting unit 30-i in the output bus unit 16-i inverts the power supply voltage $V_{CC}$ as the signal level applied to the second common data bus 20b-i in response to the second selection signal B. Then, the inverter 31-i applies the ground voltage GND to the first common data bus 20a-i as a signal level. In the equalizing period EQC, the transfer gate 34-i of the equalizing circuits 33-i in the output bus unit 16-i applies the Voltage $(½)V_{CC}$ to the first common data bus 20a-i and the second common data bus 20b-i as a signal level in response to the reset signal C. The flash memory 10 of the present invention includes the inverting unit 30-i and the equalizing circuit 33-i. Therefore, it is easy for the equalizing circuit 33-i to generate the signal level of the voltage $(½)V_{CC}$ in the equalizing period EQC. Thus, the first common data bus 20a-i and the second common data bus 20b-i can be pre-charged in the voltage $(½)V_{CC}$ in equalizing period EQC. In this way, in the flash memory 10 of the present invention, the operation speed can be improved.

In the conventional flash memory 100, the data bus 120 is compulsorily pre-charged to the voltage $(½)V_{CC}$ in the equalizing period EQC without any relation to the voltage applied to the data bus 120 in the action period ACT. On the other hand, in the flash memory 10 of the present invention, the power supply voltage $V_{CC}$ does not drop because the flash memory 10 has the inverting unit 30-i and the equalizing circuit 33-i. Therefore, the flash memory 10 of the present invention can carry out the operation faster than the conventional flash memory 100.

In the conventional flash memory 100, the power consumption in the conventional flash memory 100 increases through the pre-charging operation. On the other hand, in the flash memory 10 of the present invention, power consumption can be decreased more than that of the conventional flash memory 100 because the flash memory 10 has the inverting unit 30-i and the equalizing circuit 33-i.

It is supposed that a capacity of the data bus in the action period ACT is C. In the action period ACT of the conventional flash memory 100, the amount of the electric charge is "$C*(½)V_{CC}=(½)*(C*V_{CC})$", when the first output circuit 121 and the second output circuit 122-i drive the data bus 120.

On the other hand, in the action period ACT of the flash memory 10 of the present invention, the amount of driving electric charge is "$(x*C)*(½)V_{CC}=(½)*x*C*V_{CC}$", when the first output circuit 21-i drives the first common data bus 20a-i. Further, the amount of driving electric charge is "$((1-x)*C)*(½)VCC=(½)*(1-x)*C*V_{CC}$, when the second output circuit 22-i drives the second common data bus 20b-i. Here, x is a positive number satisfying 0<x<1. This indicates that the first connection circuit (including the inverting unit 30-i and the equalizing circuit 33-i) is arranged in the position of x times long of a total length of the first common data bus 20a-i and the second common data bus 20b-i.

As mentioned above, the first output circuit 21-i and the first common data bus 20a-i are provided in the region 42. The second output circuit 22-i and the second common data bus 20b-i are provided in the region 44. The inverting unit 30-i and the equalizing circuit 33-i are provided in the region 43 between the region 42 and the region 44. Therefore, the above-mentioned x is about ½. In this case, in the action period ACT, the amount of the electric charge is "$(½)C*(½)V_{CC}=(¼)C*V_{CC}$", when the first output circuit 21-i drives the first common data bus 20a-i, and the amount of the electric charge is "$(½)C*(½)V_{CC}=(¼)C*V_{CC}$", when the second output circuit 22-i drives the second common data bus 20b-i. Thus, in flash memory 10 of the present invention, the amount of the electric charge can be decreased to ½ which is less than that of the conventional flash memory 100. The circuit size of the first output circuit 21-i and the second output circuit 22-i can be reduced comparing with that of the first output circuit 121 and the second output circuit 122-i in the conventional flash memory 100. Also, the plates 3-1 to 3-3 are provided in the region 42, and the plates 3-4 to 3-6 are provided in the region 44. Therefore, in the above-mentioned output bus unit 16-i as an example in the flash memory 10 of the present invention, the circuit sizes of the sense amplifier unit (the sense amplifier 15-j-i and the inverter 21-j-i) and the sense amplifier unit (the sense amplifier circuit 15-(j-3)-i and the inverter 22-j-i) can be reduced to be smaller than that of the conventional first sense amplifier unit and the second sense amplifier unit, from the same reason as the above-mentioned.

Hereinafter, the difference of the flash memory 10 of the present invention from the conventional semiconductor memory device described in Japanese Laid Open Patent Application (JP-P2000-149565A) will be described. In the conventional semiconductor memory device described, a sense amplifier is connected with an input of a data bus driver (70: a reference numeral in JP-P2000-149565A is expressed with brackets, and similar in the later) through an I/O line (80). A data bus (90) is connected with an output of the data bus driver (70). An equalizing circuit (60) equalizes the data bus (90) by using the signal levels applied to the I/O line (80) and the data bus (90). On the other hand in the flash memory 10 of the present invention, the sense amplifiers 15-j-i are connected with the first output circuit 21-i of the first output circuit 21-i. The first common data bus 20a-i is connected with the output of the first output circuit 21-i. The second sense amplifiers 15-(j-3)-i are connected with the second output circuit 22-i of the second output circuit 22-i. The second common data bus 20b-i is connected with the output of the second output circuit 22-i. The inverting unit 30-i of the output bus unit 16-i is connected with the first common data bus 20a-i and the second common data bus 20b-i. The equalizing circuit 33-i of the output bus unit 16-i equalizes the data bus 20 of the first common data bus 20a-i and the second common data bus 20a-i by using the signal levels applied to the first common data bus 20a-i and the second common data bus 20b-i.

Therefore, in the conventional semiconductor memory device, the data bus (90) is equalized by using the signal levels applied to the I/O line (80) and the data bus (90) as mentioned above. That is to say, the data bus (90) is equalized by using the signal level applied to the input of the data bus driver (70) and the signal level that the data bus driver (70) outputs to the data bus (90). Therefore, only one inverting unit (the data bus driver (70)) can be provided for one data bus (90). On the other hand, in the flash memory 10 of the present invention, the data bus 20 (the first common data bus 20a-i and the second common data bus 20b-i) is equalized by using the signal levels applied to the first common data bus 20a-i and the second common data bus 20b-i. That is, the data bus 20 (the first common data bus 20a-i and the second common data bus 20b-i) is equalized by using the signal level that the first output circuit 21-i outputs to the first common data bus 20a-i and the signal level that the inverting unit 30-i outputs to the second common data bus 20b-i. In addition, the data bus 20 (the first common data bus 20a-i and the second common data bus 20b-i) is equalized by using the signal level that the second output circuit 22-i outputs to the second common data bus 20b-i and the signal level that the inverting unit 30-i outputs to the first common data bus 20a-i. Thus, the first output circuit 21-i and the second output circuit 22-i can be provided for the one data bus 20 in parallel.

Moreover, in the conventional semiconductor memory device described in the JP-A 2000-149565, it is assumed that the amount of the electric charge is $C*(1/2)V_{CC}=(1/2)*C*V_{CC}$, when the data bus driver (70) drives the data bus (90) in the action period is. On the other hand, in the flash memory 10 of the present invention, the amount of the electric charge is $(1/2)C*(1/2)V_{CC}=(1/4)*C*V_{CC}$, when the first output circuit 21-i drives the first common data bus 20a-i and when the second output circuit 22-i drives the second common data bus 20b-i in the action period ACT. Thus, the amount of the electric charge in the flash memory 10 of the present invention is smaller than that of the conventional semiconductor memory device. Therefore, in flash memory 10 of the present invention, the circuit sizes of first output circuit 21-i and the second output circuit 22-i can be reduced to be smaller than that of the data bus driver (70) in the conventional semiconductor memory device.

Also, in the flash memory 10 of the present invention, the output bus unit 16-i includes the first output circuit 21-i and the second output circuit 22-i. However, the present invention is not limited to this configuration. It should be noted that the output bus unit 16-i may not include the inverter as an input circuit. That is, the above-mentioned sense amplifier unit may not include the inverter. As shown in FIG. 7, the sense amplifiers 15-j-i of the first sense amplifier units output the data output signal to the first common data bus 20a-i in response to the first selection signal A of the low level from the control circuit 4. The sense amplifiers 15-(j-3)-i of a second sense amplifier unit output the data output signals to the second common data bus 20b-i in response to the second selection signal B of the low level from the control circuit 4. In this case, the input/output buffer section 6 does not invert the signal level of the signal on the third data bus 20c-i.

This modification of the present invention will be described by using the output bus unit 16-1 as an example.

First, the output of one of the sense amplifiers 15-j-i becomes effective. The control circuit 4 checks the operation to be carried out by the flash memory 10 in response to the control data from the address buffer section 2. As a result, for instance, it is supposed that the control circuit 4 determines that the sense amplifier 15-j-i in the plate 3-j outputs the data output signal onto the output bus unit 16-1. At this time, the control circuit 4 outputs the first selection signal A of the low level to specify the action period ACT. In the action period ACT, the sense amplifier 15-j-i outputs the data output signal onto the first common data bus 20a-i in response to the first selection signal A of the low level from the control circuit 4. In this case, the input/output buffer section 6 generates an output data from the data output signal in which the signal level of the output signal is adjusted in accordance with the external signal level, and is output onto the third data bus 20c-i. Then, the input/output buffer section 6 outputs the generated data to the outside of the flash memory 10 through the terminal 7-i.

Next, it is supposed that the output of another of the sense amplifier among the sense amplifiers 15-j-i becomes effective. The control circuit 4 checks the operation to be carried out by the flash memory 10 in response to the control data from the address buffer section 2. As a result, for instance, it is supposed that the control circuit 4 determines that the sense amplifier 15-(j-3)-i in the plate 3-j outputs the data output signal onto the output bus unit 16-i. At this time, the control circuit 4 outputs the second selection signal B of the low level to specify the action period ACT. In the action period ACT, the sense amplifier 15-(j-3)-i outputs the data output signal to the second common data bus 20b-i in response to the second selection signal B of the low level from the control circuit 4. Thus, the input/output buffer section 6 generates an output data from the data output signal to be adaptive to the external signal level and output onto the third data bus 20c-i. Then, the input/output buffer section 6 outputs the generated data to the outside of the flash memory 10 through the terminal 7-i.

Moreover, in flash memory 10 of the present invention, the output bus unit 16-i includes the first output circuit 21-i and the second output circuit 22-i. However, the present invention is not limited to this configuration. It should be noted that the output bus unit 16-i may include output buffer circuits (not shown) in place of the first and second output circuits. The output buffer does not invert the signal level of the data output signal from the sense amplifier. In this case, the above-mentioned sense amplifier unit includes the inverter and the output buffer. For instance, it is supposed that the output buffer connected with the sense amplifier 15-j-i outputs the data output signal from the sense amplifier 15-j-i to the first common data bus 20a-i in response to the first selection signal A of the low level. In this case, the output buffer connected with the sense amplifier circuit 15-(j-3)-i outputs the data output signal from the sense amplifier 15-(j-3)-i to the second common data bus 20b-i in response to the second selection signal B of the low level. Thus, the input/output buffer section 6 does not invert the signal level of the signal on the third data bus 20c-i.

As described above, the flash memory 10 of the present invention can operate at high speed with low power consumption. There, the Flash memory 10 of the present invention can reduce the circuit size.

What is claimed is:

1. A semiconductor memory device comprising:
    an inverting section provided between an output of a first sense amplifier section and an output of a second sense amplifier section, and configured to invert the output of said first sense amplifier section;
    an equalizing circuit configured to couple the output of said first sense amplifier section and an output of said inverting section in a predetermined period;
    a common bus; and
    a bus driver circuit configured to transfer one of an output of said inverting section and the output of said second sense amplifier section on said common bus onto an output bus with inversion or no inversion of the one output.

2. The semiconductor memory device according to claim 1, wherein said bus driver circuit inverts the output of said inverting section and outputs the inverted output onto said output bus, and outputs the output of said second sense amplifier section onto said output bus with no inversion.

3. The semiconductor memory device according to claim 1, wherein when one of the output of said first sense amplifier section and the output of said second sense amplifier section is effective, the other is not effective.

4. The semiconductor memory device according to claim 1, wherein a distance between said common bus and said first sense amplifier section is longer than a distance between said common bus and said second sense amplifier section.

* * * * *